(12) United States Patent
Choi et al.

(10) Patent No.: US 7,569,486 B2
(45) Date of Patent: Aug. 4, 2009

(54) SPIN ON GLASS (SOG) ETCH IMPROVEMENT METHOD

(75) Inventors: Yong Seok Choi, Mckinney, TX (US); Jeannette Michelle Jacques, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 83 days.

(21) Appl. No.: 11/746,217

(22) Filed: May 9, 2007

(65) Prior Publication Data

US 2008/0280447 A1 Nov. 13, 2008

(51) Int. Cl.
*H01L 21/311* (2006.01)
*H01L 23/48* (2006.01)
*H01L 23/52* (2006.01)
*H01L 29/40* (2006.01)

(52) U.S. Cl. .............. 438/702; 257/774; 257/E21.229
(58) Field of Classification Search .............. 438/638, 438/618, 702; 257/774, E21.229
See application file for complete search history.

(56) References Cited

U.S. PATENT DOCUMENTS 6,743,713 B2 * 6/2004 Mukherjee-Roy et al. ... 438/638
7,232,748 B2 * 6/2007 Ali .............................. 438/618

* cited by examiner

*Primary Examiner*—Davienne Monbleau
*Assistant Examiner*—Monica D Harrison
(74) *Attorney, Agent, or Firm*—Wade J. Brady, III; Frederick J. Telecky, Jr.

(57) ABSTRACT

A system and method of preventing pattern lifting during a trench etch/clean process is disclosed. A first layer comprising a first dip is formed over a first via pattern. A trench resist layer is formed. The trench resist layer is patterned with a trench reticle to produce a second via pattern in the trench resist layer over the first via pattern. A photo resist over the first via pattern is opened during a trench processing. Thus, an additional pattern added on a trench pattern reticle is used to open, i.e., remove resist over, a huge via feature area causing under layer dip.

20 Claims, 10 Drawing Sheets

SPIN ON GLASS (SOG) ETCH IMPROVEMENT METHOD

FIELD

The subject matter of the embodiments relates to systems and methods of improving semiconductor etching. More particularly, the subject matter of the embodiments relates systems and methods of improving semiconductor etching of a multi-layer semiconductor device consisting of a spin on glass layer.

BACKGROUND

For a Back End Of Line Dual Damascene Trench process, trilayer lithograph stack, i.e., resist, Spin On Glass (SOG)/Under Layer (UL) where the UL is an organic material similar to resist, is being used as the conventional process. During the UL coating process, a dip of about 60 nm is formed over the wide, e.g., >/=1 um, via pattern relative to the neighboring UL top surface level. After the SOG coating, the dipping region ends up with 60 nm thicker SOG compared to the neighbor. Some Dual Damascene Trench etch recipes cannot fully remove the thick SOG over the dipping UL during the main dielectric etch step. During the next UL etch, the undercut causes the big via pattern features to float and drift during cleaning.

FIGS. 2A-2H show the conventional process steps to form an example trilayer lithograph stack.

FIG. 2A shows the beginning formation of an incoming wafer. In particular, the incoming wafer 121 includes a Cu/ultra-low K (ULK) layer 101, an ES layer 102 and an ULK layer 103.

FIG. 2B shows a resultant semiconductor device stack after an incoming wafer is subjected to a via layer resist coating. In particular, semiconductor device stack 122 includes a Cu/ULK layer 101, an ES layer 102, an ULK layer 103, and a resist layer 118.

FIG. 2C shows a resultant semiconductor device stack after a semiconductor device stack is subjected to a via layer patterning. In particular, semiconductor device stack 123 includes a Cu/ULK layer 101, an ES layer 102, an ULK layer 103, and a resist layer 118. The resist layer 118 is subjected to a via layer patterning, i.e., exposure and development with a via photomask. The via layer patterning produces a via 119 in the resist layer 118.

FIG. 2D shows a resultant semiconductor device stack after a semiconductor device stack is subjected to a via etch process. In particular, semiconductor device stack 124 includes a Cu/ULK layer 101, an ES layer 102, an ULK layer 103, and a resist layer 118. A via etch process results in a thinning of the resist layer 118 and a transfer of the via pattern 119 into the ULK layer 103. Thus, a trough 120 through both the resist layer 118 and the ULK layer 103 results from a via etch process on the semiconductor device stack 123.

FIG. 2E shows a resultant semiconductor device stack after a semiconductor device stack is subjected to an ashing/wet cleaning process. In particular, semiconductor device stack 125 includes a Cu/ULK layer 101, an ES layer 102, and an ULK layer 103. An ashing/wet cleaning process results in the resist layer 118 from FIG. 2D being removed. Thus, the trough 120 remains through the ULK layer 103 after the ashing/wet cleaning process.

FIG. 2F shows a resultant semiconductor device stack after a semiconductor device stack is subjected to an underlayer (UL) coating. In particular, semiconductor device stack 126 includes a Cu/ULK layer 101, an ES layer 102, an ULK layer 103, and an UL layer 104. The UL layer 104 is shown to fill the via 120 shown in FIG. 2E and to extend over the ULK layer 103. A significant dip 211, e.g., ~40 nm or larger, occurs over the large, e.g., ~1 um or larger, via 120 formed in the ULK layer 103. Such a dip 211 causes problems later in the process as described below.

FIG. 2G shows a resultant semiconductor device stack after a semiconductor device stack is subjected to a SOG coating. In particular, semiconductor device stack 127 includes a Cu/ULK layer 101, an ES layer 102, an ULK layer 103, an UL layer 104, and a SOG layer 105. The SOG layer 105 is shown to fill the dip 211 shown in FIG. 2F.

FIG. 2H shows a resultant semiconductor device stack after a semiconductor device stack is subjected to a resist coating. In particular, semiconductor device stack 128 includes a Cu/ULK layer 101, an ES layer 102, an ULK layer 103, an UL layer 104, a SOG layer 105, and a trench resist layer 201. The resist layer 201 is formed over the SOG layer 105 after a resist coating process is performed on the semiconductor device stack shown in FIG. 2G.

FIGS. 3A-3F show the conventional process steps for a trilayer lithographic stack.

FIG. 3A shows the beginning formation of a semiconductor device stack 128. In particular, semiconductor device 128 includes a Cu/ULK layer 101, an ES layer 102, a ULK layer 103, an UL layer 104, a SOG layer 105, and a trench resist layer 201. The UL layer 104 is shown to include a dip 211.

FIG. 3B shows a resultant semiconductor device stack subsequent to a SOG etch process. In particular, semiconductor device stack 207 includes a Cu/ULK layer 101, an ES layer 102, a ULK layer 103, an UL layer 104, and a SOG layer 105. The trench resist layer 201 shown in FIG. 3A is removed during a SOG etch process and a portion of the SOG is also removed producing a thinned SOG layer 105 shown in FIG. 3B.

FIG. 3C shows a resultant semiconductor device stack subsequent to an UL etch process. In particular, semiconductor device stack 208 includes a Cu/ULK layer 101, an ES layer 102, a ULK layer 103, an UL layer 104, and a SOG layer 105. A minimal amount of the SOG layer 105 shown in FIG. 3B is removed during the UL etch process.

FIG. 3D shows a resultant semiconductor device stack subsequent to an ULK etch process. In particular, semiconductor device stack 209 consists of a Cu/ULK layer 101, an ES layer 102, a ULK layer 103, and an UL layer 104. A very small portion of the SOG layer 105 from FIG. 3C remains after the ULK etch, shown in FIG. 3D as a SOG remnant 105.

Thus, because of the dip 211 produced during the underlayer coating shown in FIG. 2F the SOG layer 105 above the dip 211 is larger than would be produced without such a dip 211. The thick SOG layer 105 above the dip 211 from FIG. 3C cannot be completely removed during the ULK etch process with a conventional microloading/ULK damage minimization recipe. Alternately, the thick SOG layer 105 above the dip 211 from FIG. 3C can be removed by using etch recipes optimized for that special purpose, but use of such recipes limits options to improve other serious challenges, e.g., microloading that results in varying etch depth that depends on the pattern density, and ULK damage during ULK etch.

FIG. 3E shows a resultant semiconductor device stack subsequent to an in-situ ash process. In particular, semiconductor device 210 consists of a Cu/ULK layer 101, an ES layer 102, and a ULK layer 103. The SOG remnant 105 shown FIG. 3D prevents a thorough removal of the UL layer 104 that resides in the via in the ULK layer 103. As a result of the SOG remnant 105 shown in FIG. 3D, an in-situ ash process leaves behind UL material 104 within the ULK layer 103 via.

FIG. 3F shows a resultant semiconductor device stack subsequent to solvent cleaning process. In particular, semiconductor device 212 consists of a Cu/ULK layer 101, an ES layer 102, and a ULK layer 103. The UL layer material 104 in the ULK layer 103 via and a portion of the ES layer 102 is lifted off and floats on the wafer surface during the solvent cleaning process. Penetration and agitation of the cleaning solvent is needed to lift the UL layer material 104 and a portion of the ES layer 102, shown by the arrows surrounding the UL layer material 104 and a portion of the ES layer 102.

Thus, as can be seen from FIGS. 3A-3F a thick SOG layer, e.g., approximately 130 nm, cannot be fully removed during an ULK etch process resulting in a portion of an UL material being left behind in a ULK layer via.

Attempts have been made to relieve the dipping problem and the associated thick SOG coating. Modification of the UL or SOG coating process has been tried but had negligible improvement. A dual UL coating can planarize before SOG coating, but it is an expensive, complex, and long process. An etch process that can remove thick SOG during dielectric etch completely, but introduces ULK damage and micro-loading. Segmentations may be added inside of large features, but segmentations are not always an option due to design constraints.

Accordingly, the present teachings solve these and other problems of the prior art's SOG removal during ULK etch resulting in the prevention of an UL material being left behind in an ULK layer via.

SUMMARY

In accordance with the teachings, a method of preventing pattern lifting during a trench etch/clean process is disclosed. A first layer comprising a first dip is formed over a first via pattern. A trench resist layer is formed. The trench resist layer is patterned with a trench reticle to produce a second via pattern in the trench resist layer over the first via pattern. A photo resist of the first via pattern is opened during a trench processing.

In accordance with the teachings, a multilayer semiconductor device is disclosed that includes a first layer comprising a first dip over a first via pattern. A trench resist layer is patterned with a trench reticle, the trench resist layer including a second via pattern over the first via pattern. A photoresist of the first via pattern is opened during a trench patterning.

Additional advantages of the embodiments will be set forth in part in the description which follows, and in part will be obvious from the description, or may be learned by practice of the embodiments. The advantages will be realized and attained by means of the elements and combinations particularly pointed out in the appended claims.

It is to be understood that both the foregoing general description and the following detailed description are exemplary and explanatory only and are not restrictive of the teachings, as claimed.

The accompanying drawings, which are incorporated in and constitute a part of this specification, illustrate embodiments of the teachings and together with the description, serve to explain the principles of the embodiments.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

The solution according to the teachings disclosed herein is to add a similar or larger via feature to a trench pattern reticle so that a same or similar via pattern area can be open without resist over the large via feature after trench patterning. After a trench lithography process, the large via features are open without resist. During a SOG etch step, most of the thick SOG over a dipped UL can be removed in contrast to a conventional SOG etch step, i.e., resist covering the huge via feature area, that leaves the thick SOG untouched. During the main dielectric etch step, the remaining SOG can then be completely removed while dielectrics material is etched away.

FIGS. 1A-1E show the process steps for a processing a trilayer lithographic stack, in accordance with the principles of the present teachings.

Figure 1A:
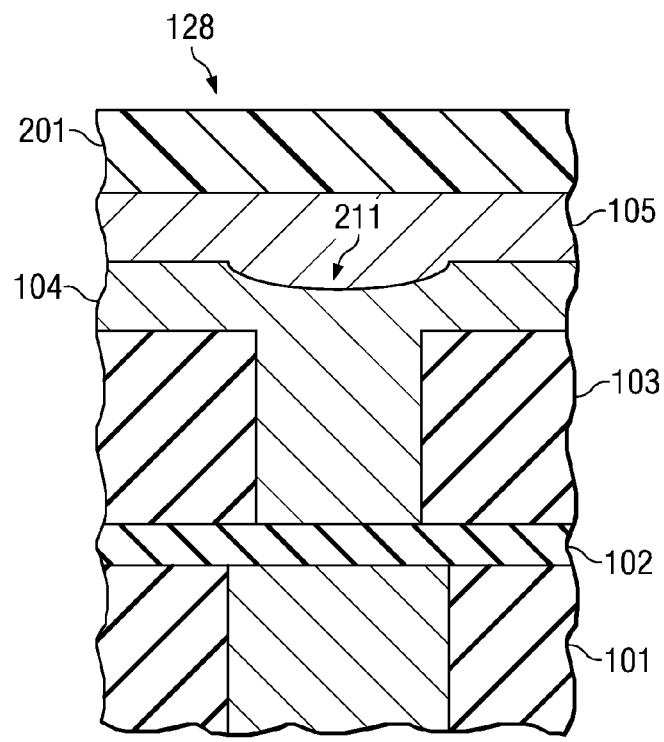
FIGS. 1A-1F show the process steps for processing trilayer lithographic stack, in accordance with the principles of the present teachings.

FIG. 1A shows the beginning formation of a semiconductor device prior to etching, in accordance with the principles of the present teachings. In particular semiconductor device 128 can include a Cu/Ultra-Low K layer 101, an ES layer 102, a ULK layer 103, an UL layer 104, a SOG layer 105, and a trench resist layer 201. The UL layer 105 is shown to consist of a dip 211. As can be seen from FIG. 1A, the beginning semiconductor stack of the present teachings is the same as the beginning semiconductor stack of the prior art. However, the process according to the principles of the present teachings diverges from the prior art in FIG. 1B.

Figure 1B:
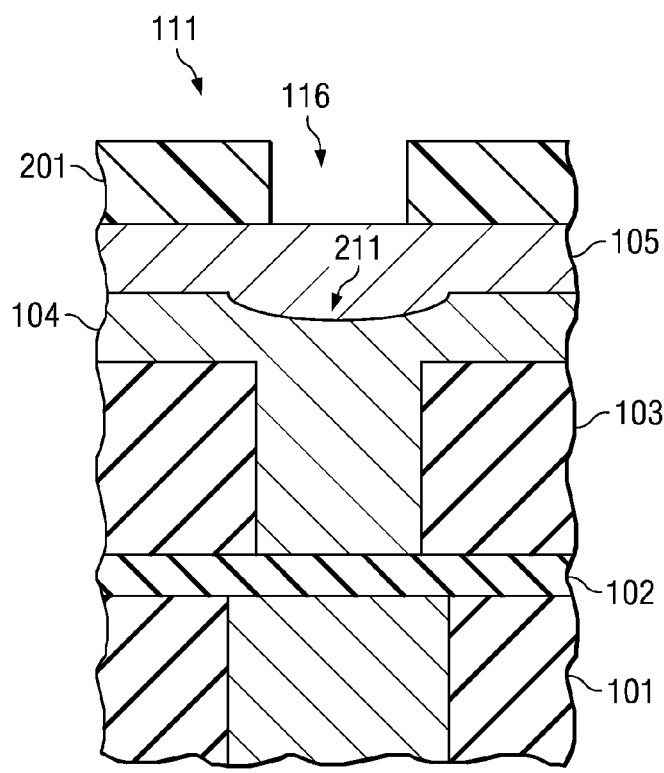

FIG. 1B shows a resultant semiconductor device stack that includes a via in the uppermost trench resist layer, in accordance with the principles of the present teachings. In particular, semiconductor device stack 111 can include a Cu/Ultra-Low K layer 101, an ES layer 102, a ULK layer 103, an UL layer 104, a SOG layer 105, and a trench resist layer 201. The SOG layer 105 is shown to consist of a dip 211. Open area 116 is formed during trench lithography, i.e., exposure on the resist and development, process since the new trench reticle has the same via pattern on the reticle, before any etch processes. The width of via 116 is show to be approximately the same size as dip 211. However, the width of via 116 can be any size that appropriately thins the SOG layer 105 above dip 211 as shown in FIG. 1C.

Figure 1C:
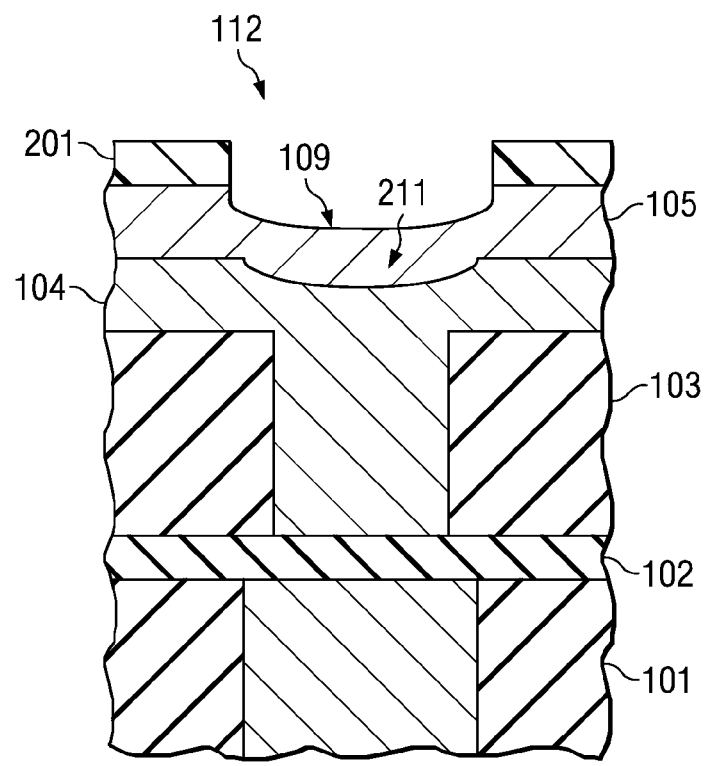
Figure 3A:
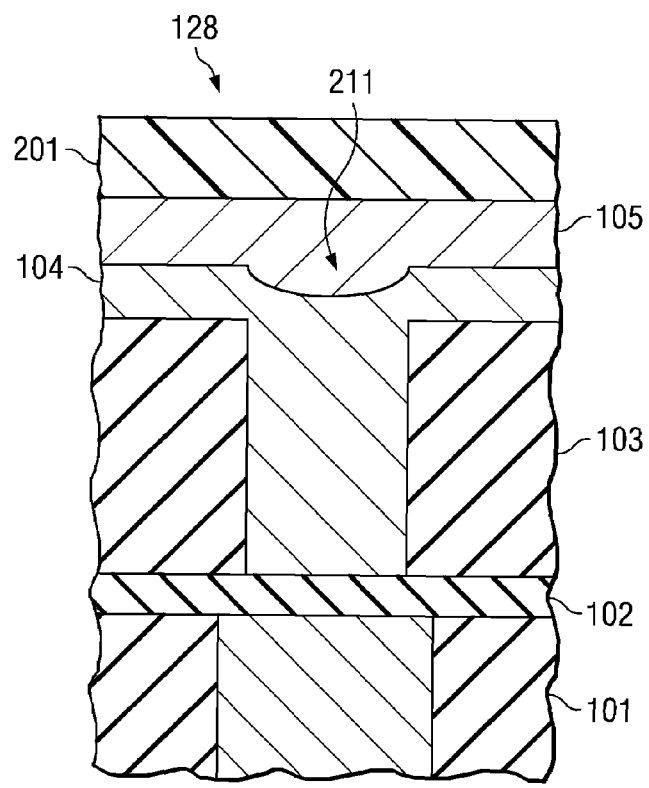
FIGS. 3A-3F show conventional process steps processing the trilayer lithographic stack shown in FIGS. 2A-2H.
Figure 3B:
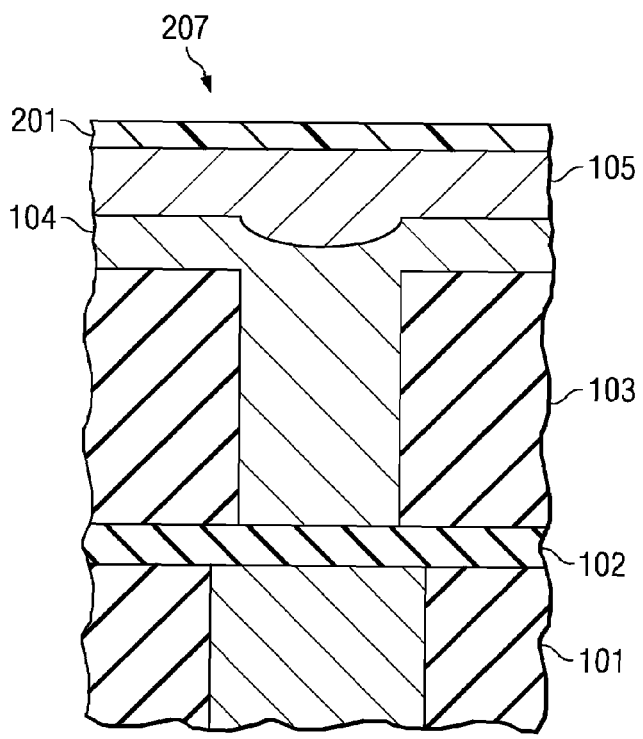
Figure 3C:
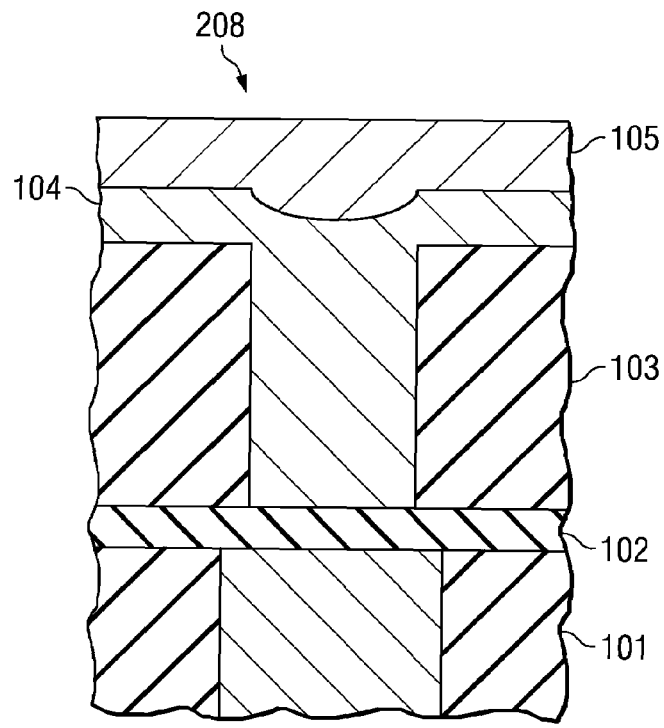

FIG. 1C shows a resultant semiconductor device stack 112 subsequent to a SOG etch process. In particular, semiconductor device stack 112 can include a Cu/ULK layer 101, an ES layer 102, a ULK layer 103, an UL layer 104, a SOG layer 105, and a trench resist layer 201. The trench resist layer 201 shown in FIG. 1C is consumed during the SOG etch to produce a thinned trench resist layer 201 shown in FIG. 1B. Moreover, in contrast to the conventional SOG etch process shown in FIG. 3B where the SOG layer 105 is not touched by the SOG etch process, the SOG layer 105 produced in accordance with the principles of the present teachings is dipped during the SOG etch process to produce a dip 109. Since most of the thick SOG layer 105 over dip 211 is etched away during the SOG etch, the remaining SOG can easily be removed during the ULK etch shown in FIG. 1D.

Figure 1D:
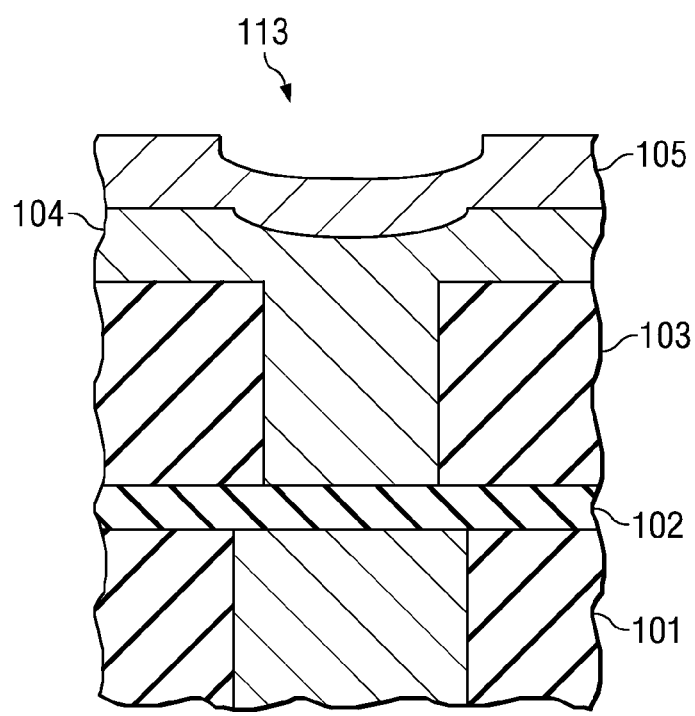

FIG. 1D shows a resultant semiconductor device 113 subsequent to an UL etch process. In particular, semiconductor device 113 can include a Cu/ULK layer 101, an ES layer 102, a ULK layer 103, an UL layer 104, and a SOG layer 105. The trench resist layer 201 shown in FIG. 1C is removed during an UL etch process.

Figure 1E:
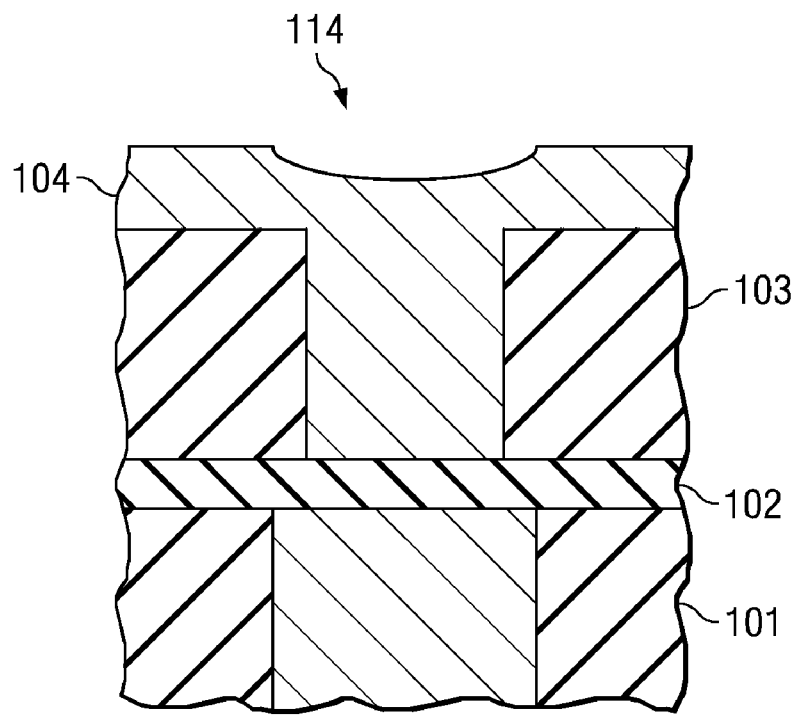

FIG. 1E shows a resultant semiconductor device 114 subsequent to an ULK etch process. In particular, semiconductor device 114 can include a Cu/ULK layer 101, an ES layer 102, a ULK layer 103, and an UL layer 104. In contrast to the conventional ULK etch shown in FIG. 3D where a SOG remnant 203 remains after the ULK etch, in accordance with the principles of the present teachings a ULK etch completely removes the SOG layer 105 from the semiconductor device 113.

Figure 1F:
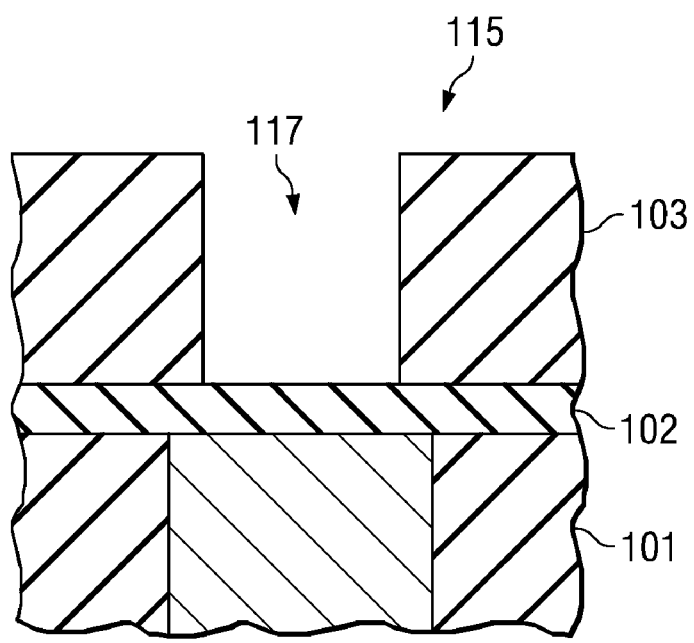
Figure 2A:
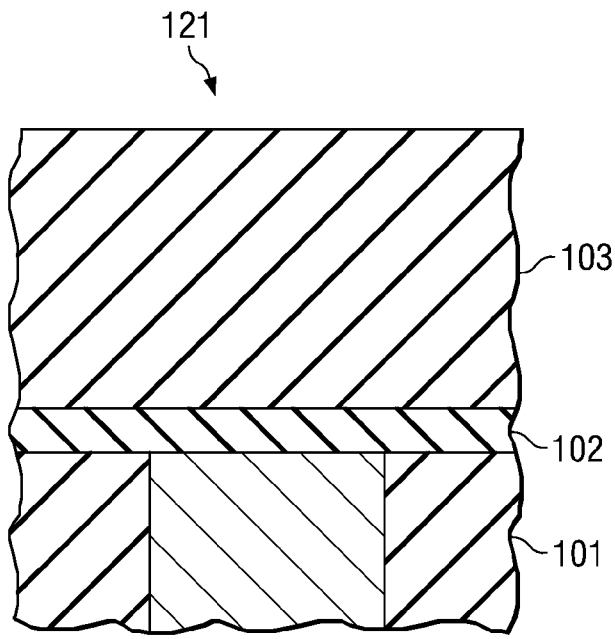
FIG. 2A-2H show conventional process steps to form a trilayer lithographic stack.
Figure 2B:
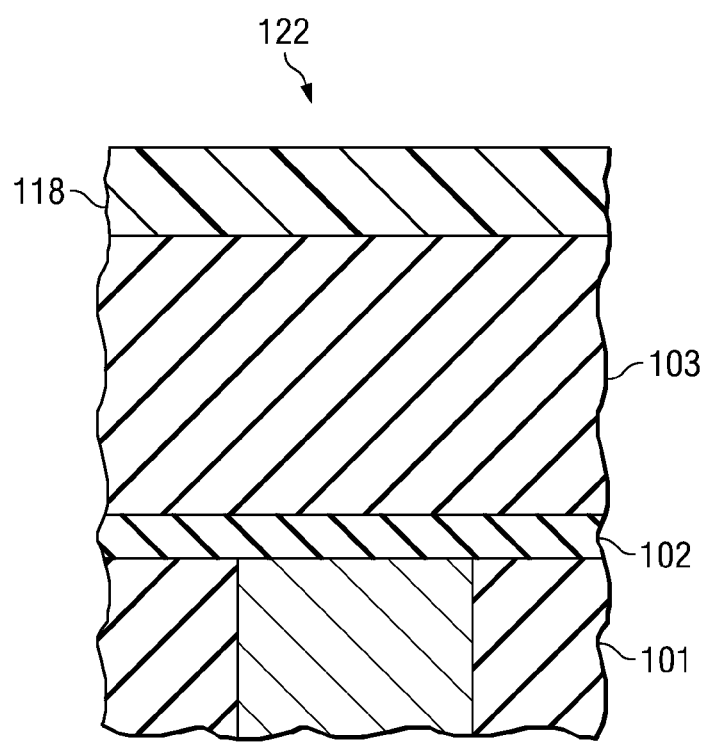
Figure 2C:
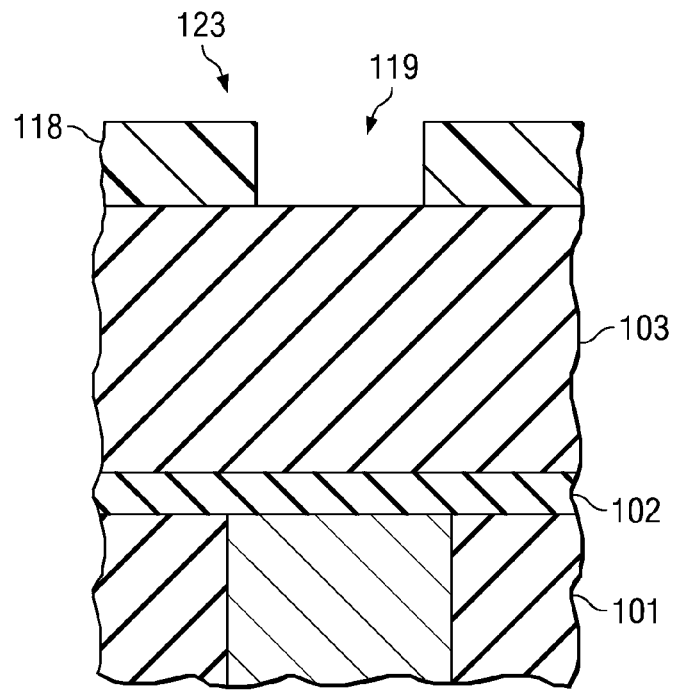
Figure 2D:
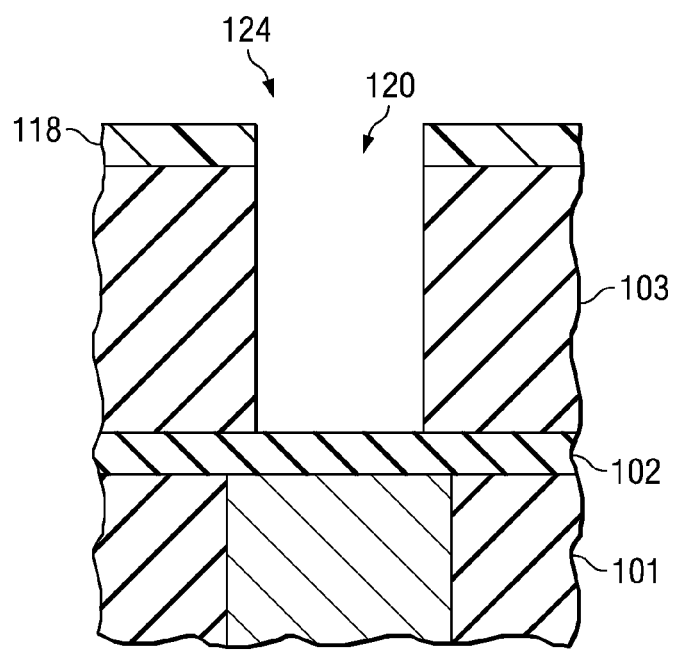
Figure 2E:
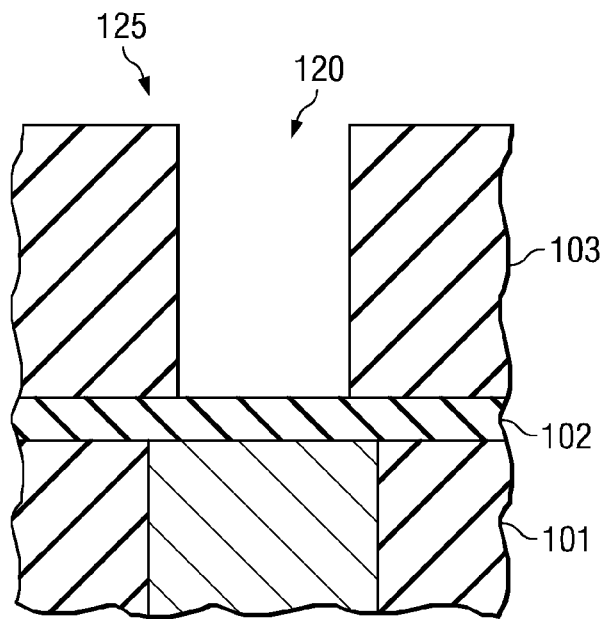
Figure 2F:
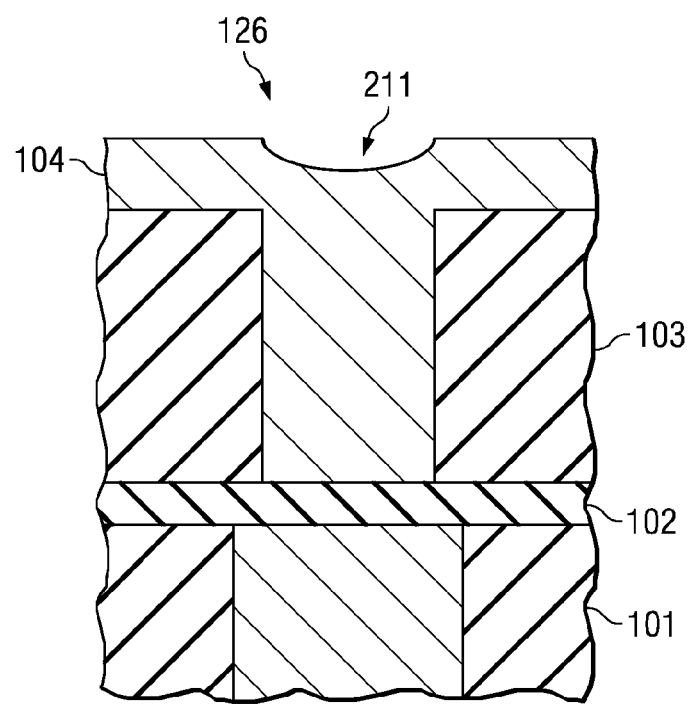
Figure 2G:
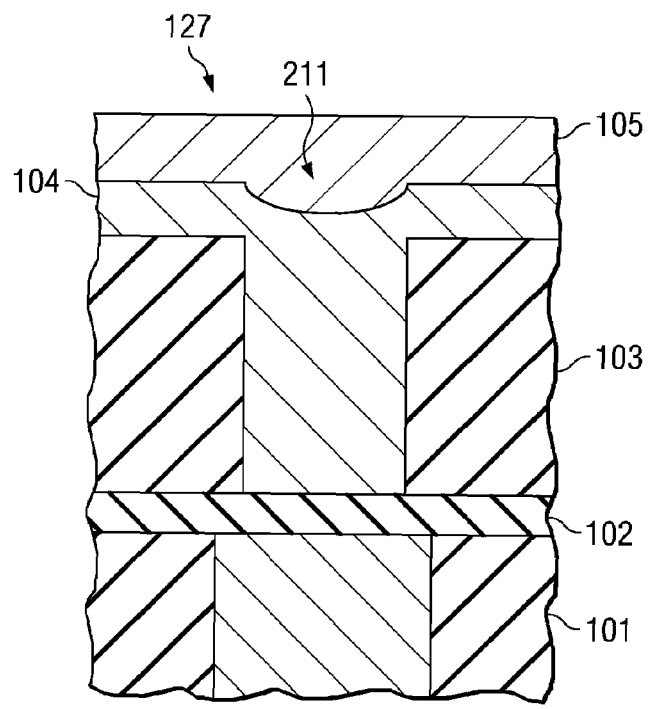
Figure 2H:
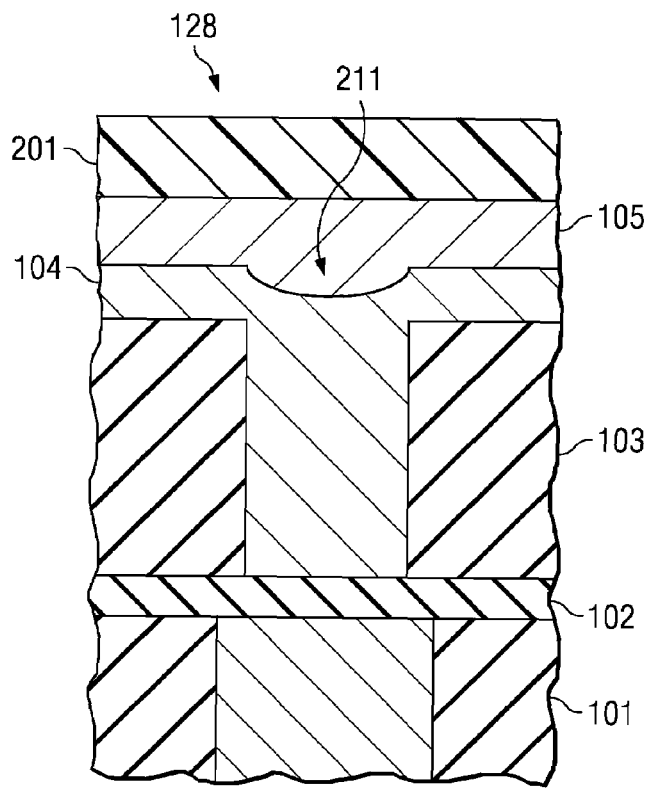

FIG. 1F shows a resultant semiconductor device stack 115 subsequent to an UL ash process. In particular, semiconductor device 115 can include a Cu/ULK layer 101, an ES layer 102, and a ULK layer. 103. In contrast to the conventional UL ash process shown in FIG. 3E where a central portion of the ULK layer 104 cannot be properly removed and remains after the UL ash process, in accordance with the principles of the present teachings a UL ash process completely removes the conventionally left behind central portion of the ULK layer 104. A clean via 117 remains after the UL ash process. A solvent cleaning step is finally used to clean any remaining residues.

Figure 3D:
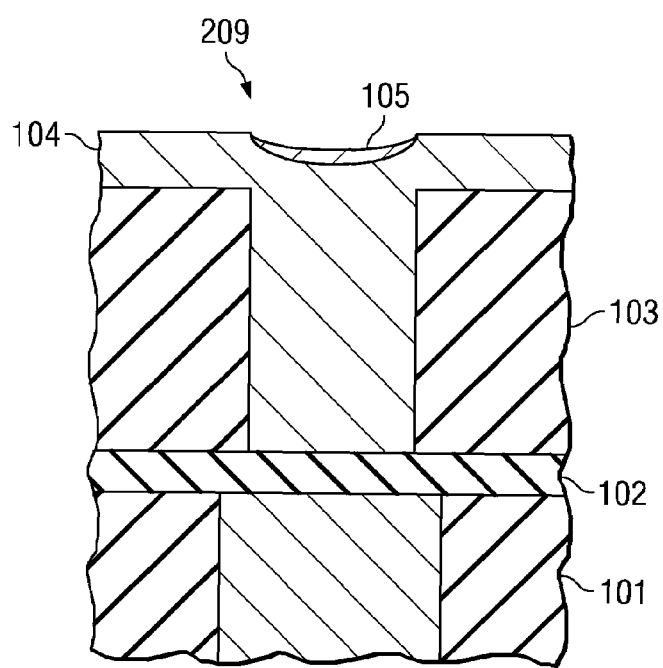
Figure 3E:
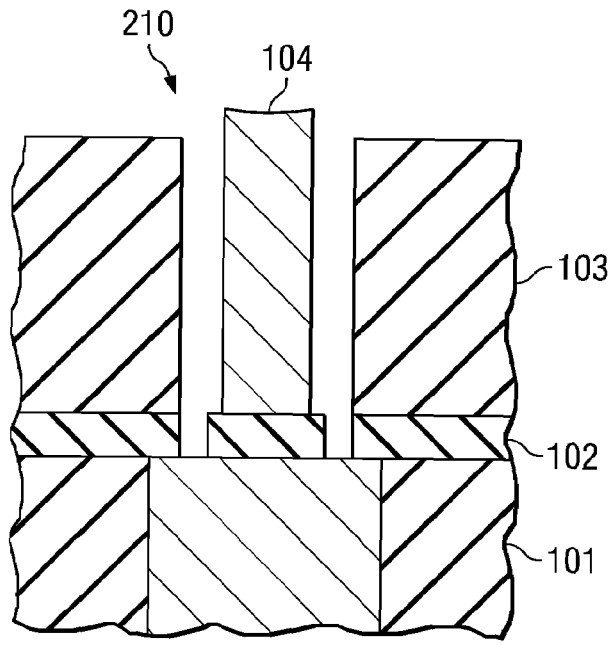
Figure 3F:
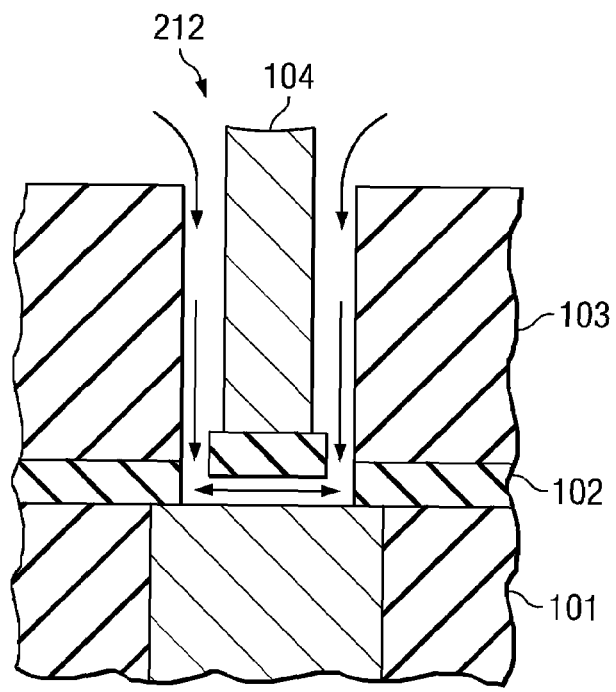

The elimination of the SOG remnant 203 from FIG. 3D in turn allows for a clean via 117 to be formed during a UL ash process within the central portion of the ULK layer 103, i.e., eliminating the central portion of the ULK layer 104 shown in FIG. 3E. A thick SOG layer, e.g., approximately 130 nm, in accordance with the principles of the present teachings can be fully removed during a ULK etch process with, e.g., a microloading/ULK damage minimization recipe.

Thus, a trench pattern on a trench mask in accordance to the teachings which is similar to a conventional via pattern is used to open a resist layer over an area with a large via etched structure, a related dip and a thickened SOG layer.

Although not shown in FIG. 1, the semiconductor device stack according to the teachings can employ a capping layer or layers between the ULK and photo resist layers. Capping layers are typically oxides or nitrides, such as, e.g., a Tetraethyl Orthosilicate ("TEOS") capping layer. Use of such a capping layer is within the spirit and scope of the teachings.

While the embodiments have been illustrated with respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings will be apparent to those skilled in the art from consideration of the specification and practice of the embodiments disclosed herein. It is intended that the specification and examples be considered as exemplary only, with a true scope and spirit of the teachings being indicated by the following claims.

What is claimed is:

1. A method of preventing pattern lifting during a trench etch/clean process, comprising:
   forming a dielectric layer having a first via opening therein and an upper surface;
   forming a first layer over the upper surface of the dielectric layer and which completely fills the first via opening, the first layer comprising a first dip over the first via opening;
   forming a second layer within the first dip in the first layer;
   forming a trench resist layer over the second layer;
   patterning the trench resist layer with a trench reticle to produce a second via opening in the trench resist layer which overlies the first via opening in the dielectric layer; and
   prior to etching the first layer within the first via opening in the dielectric layer, removing the trench resist during a trench processing.

2. The method of preventing pattern lifting during a trench etch/clean process according to claim 1, wherein:
   the first layer is an under layer.

3. The method of preventing pattern lifting during a trench etch/clean process according to claim 1, further comprising:
   forming the second layer comprises forming a spin on glass layer over the first layer.

4. The method of preventing pattern lifting during a trench etch/clean process according to claim 3, further comprising:
   etching the spin on glass layer to completely remove the spin on glass layer.

5. The method of preventing pattern lifting during a trench etch/clean process according to claim 3, wherein:
   the spin on glass layer is approximately 130 nm thick.

6. The method of preventing pattern lifting during a trench etch/clean process according to claim 1, wherein:
   the trench resist layer is an uppermost layer.

7. The method of preventing pattern lifting during a trench etch/clean process according to claim 1, wherein:
   the second via opening is similar in width as the first via opening.

8. The method of preventing pattern lifting during a trench etch/clean process according to claim 1, wherein:
   the layer comprising the first via pattern is a ultra-low k layer.

9. The method of preventing pattern lifting during a trench etch/clean process according to claim 1, further comprising:
   forming a spin on glass layer; and
   etching the first layer to produce a second dip in a spin on glass layer.

10. The method of preventing pattern lifting of claim 1, further comprising patterning the trench resist layer with a trench reticle to produce a second via opening in the trench resist layer which is narrower than the first via opening in the dielectric layer.

11. A multilayer semiconductor device, comprising:
    a dielectric layer having a first via opening therein and an upper surface;

a first layer over the upper surface of the dielectric layer and which completely fills the first via opening, the first layer comprising a first dip over the first via opening;

a second layer within the first dip in the first layer which completely fills the first dip in the first layer; and a trench resist layer patterned with a trench reticle, the trench resist layer comprising a second via opening therein over the first via pattern, wherein the second via opening in the trench resist layer has a similar via pattern area as the first opening in the dielectric layer.

12. The multilayer semiconductor device according to claim 11, wherein:

the first layer is an under layer.

13. The multilayer semiconductor device according to claim 11, further comprising:

the second layer comprises a spin on glass layer over the first layer.

14. The multilayer semiconductor device according to claim 13, wherein:

the spin on glass layer is etched to completely remove the spin on glass layer.

15. The multilayer semiconductor device according to claim 13, wherein:

the spin on glass layer is approximately 130 nm thick.

16. The multilayer semiconductor device according to claim 11, wherein:

the trench resist layer is an uppermost layer.

17. The multilayer semiconductor device according to claim 11, wherein:

the second via is the same width as a width of the first dip.

18. The multilayer semiconductor device according to claim 11, wherein:

the layer comprising the first via pattern is a ultra-low k layer.

19. The multilayer semiconductor device according to claim 11, further comprising:

a spin on glass layer, wherein the first layer is etched to produce a second dip in the spin on glass layer.

20. The multilayer semiconductor device according to claim 11, wherein the second via opening in the trench resist layer is narrower than the first via opening in the dielectric layer.

* * * * *